(12) United States Patent
Olin

(10) Patent No.: US 6,864,483 B2
(45) Date of Patent: Mar. 8, 2005

(54) METHOD FOR INCREASING THE MEASUREMENT INFORMATION AVAILABLE FROM A TRANSMISSION ELECTRON MICROSCOPE AND A TRANSMISSION ELECTRON MICROSCOPY DEVICE

(75) Inventor: Håkan Olin, Göteborg (SE)

(73) Assignee: Nanofactory Instruments AB, Gothenburg (SE)

( * ) Notice: Subject to any disclaimer, the term of this patent is extended or adjusted under 35 U.S.C. 154(b) by 0 days.

(21) Appl. No.: 10/203,475

(22) PCT Filed: Feb. 20, 2001

(86) PCT No.: PCT/SE01/00380
§ 371 (c)(1),
(2), (4) Date: Dec. 2, 2002

(87) PCT Pub. No.: WO01/63204
PCT Pub. Date: Aug. 30, 2001

(65) Prior Publication Data
US 2003/0116710 A1 Jun. 26, 2003

(30) Foreign Application Priority Data
Feb. 22, 2000 (SE) .............................................. 0000555

(51) Int. Cl.⁷ .............................................. H01J 37/26
(52) U.S. Cl. ...................................... 250/311; 250/307
(58) Field of Search .................................. 250/311, 307

(56) References Cited

U.S. PATENT DOCUMENTS 5,552,602 A    9/1996  Kakibayashi et al.
5,739,425 A *  4/1998  Binnig et al. .................. 73/105
5,811,804 A    9/1998  Van Blitterswijk et al.
6,242,737 B1 * 6/2001  Ohnishi et al. ............. 250/306

FOREIGN PATENT DOCUMENTS

| EP | 0665417 | 8/1992 |
| JP | 6117847 | 4/1994 |
| JP | 60-129847 | * 5/1994 |

OTHER PUBLICATIONS

Memmert et al. ("Combined Ultrahigh Vacuum Scanning Tunneling Microscope Scanning Electron Microscope System" Review of Scientific Instruments, vol. 67, No. 6, Jun. 1, 1996, pp. 2269–2273).*

* cited by examiner

Primary Examiner—John R. Lee
Assistant Examiner—James J. Leybourne
(74) Attorney, Agent, or Firm—Harness, Dickey & Pierce, P.L.C.

(57) ABSTRACT

This invention relates to a method for increasing the measurement information available from a transmission electron microscope, said information relating to a measurement sample, comprising the step of: including, in said transmission electron microscope, an atomic force microscopy device. This invention also relates to a transmission electron microscopy device, characterised in that a transmission electron microscope is combined with an atomic force microscope, positioned within said transmission electron microscope. Finally, the invention relates to a device for insertion in a transmission electron microscope, characterised in that said device comprises an atomic force microscopy device.

15 Claims, 3 Drawing Sheets

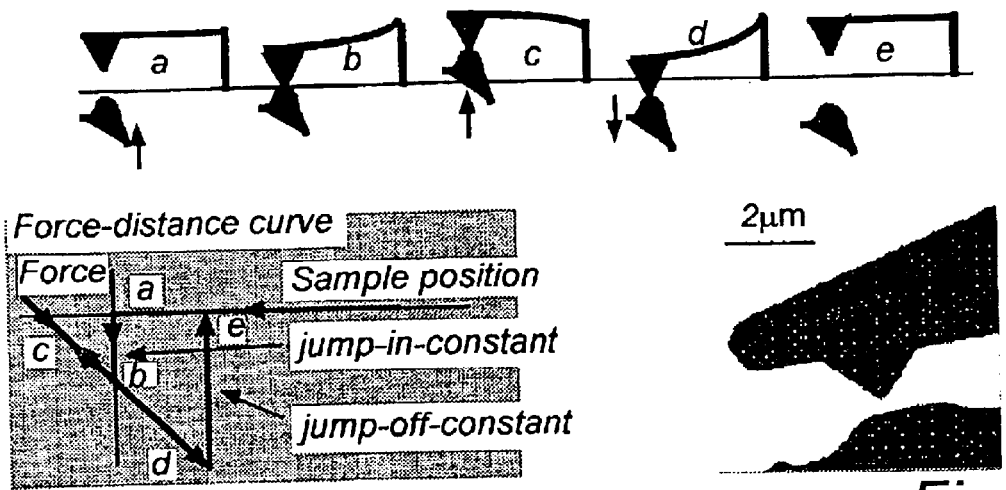
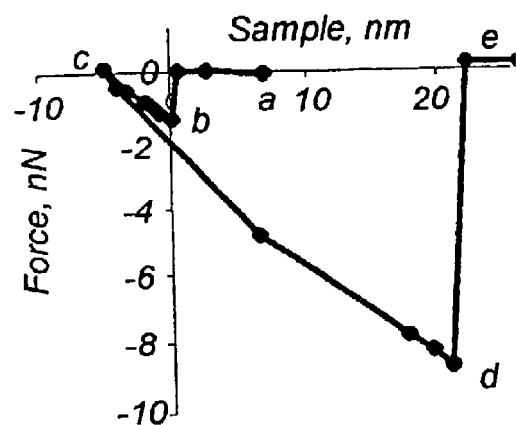
Fig. 3
Fig. 5
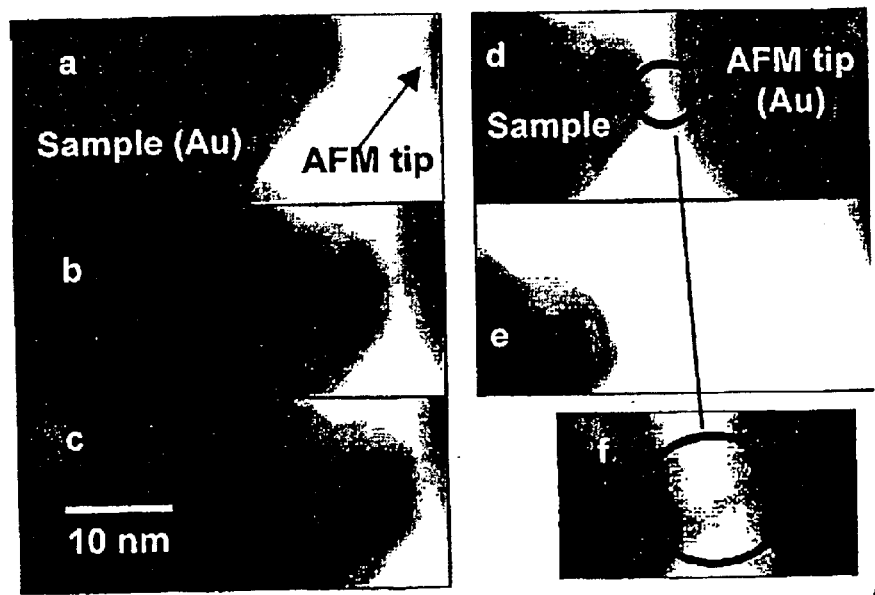
Fig. 4

METHOD FOR INCREASING THE MEASUREMENT INFORMATION AVAILABLE FROM A TRANSMISSION ELECTRON MICROSCOPE AND A TRANSMISSION ELECTRON MICROSCOPY DEVICE

TECHNICAL FIELD OF THE INVENTION

This invention relates to a method for increasing the measurement information available from a transmission electron microscope, said information relating to a measurement sample. Said invention also relates to a transmission electron microscopy device and a device for insertion in a transmission electron microscope.

BACKGROUND ART

Force interactions between nano-particles has been studied for a long time. One technique is Transmission Electron Microscopy (TEM), in which direct visualisation of the interacting particles gives understanding of the interaction. However, this method only gives a visual presentation of the interaction, and its use is therefor limited.

One improved method and device for studying force interactions between nano-particles is the TEM-STM microscope (transmission electron microscope-scanning tunnelling microscope). In this kind of microscope a scanning tunnelling microscope (STM) is placed inside a transmission electron microscope (TEM), enabling simultaneous measurements of sample structure as well as electrical properties of the samples, such as conductance. This microscopy technique is much helpful when studying certain aspects of particle interaction. However, there is still a need for extending the range of experiments that can be performed, and thereby gaining a deeper understanding of the nature of matter.

SUMMARY OF THE INVENTION

The above mentioned issue is resolved in accordance with the invention by a method of the above mentioned kind, comprising the step of including, in said transmission electron microscope, an atomic force microscopy device. This method enables atomic force microscopy (AFM) measurements to be made in a TEM environment, thereby enabling simultaneous TEM and AFM measurements, for investigating the relationship between the interaction force between and the geometry of interacting particles. Preferably, said method comprises the steps of visualising a sample and a probe, being a part of said atomic force microscopy device, using the transmission electron microscope, and simultaneously investigating a force interaction between said sample and said probe using the atomic force microscopy device being arranged within said transmission electron microscope.

The step of investigating the force interaction suitably includes the step of measuring the deflection of a cantilever on which said probe is fastened, said cantilever and probe being parts of said atomic force microscopy device. This provides for a simple way to determine the interaction force between the sample and the probe. According to a preferred embodiment the step of measuring the deflection of the cantilever includes the step of measuring the deflection by using an electron beam from said transmission electron microscope. This is a simple, space efficient method, since the means for creating this beam is already provided in the TEM. In accordance with another embodiment of the invention, the step of measuring the deflection of the cantilever includes the step of measuring the deflection by using a measurement device mounted on said cantilever for detecting a physical property, that is changeable due to strain. This is also a space efficient solution, which may be realised for example by a strain gauge, being fastened on said cantilever, or by means of a magnetoelastic measuring device. In accordance with a third embodiment of the invention, the step of measuring the deflection of the cantilever includes the step of measuring the deflection by using a measurement device comprising a radiation source, for irradiating an reflection surface on said cantilever, whereupon said radiation may be detected by a detection means in order to determine an amount of deflection of said cantilever.

Further, the above mentioned issue is resolved in accordance with the invention by a transmission electron microscopy device, being characterised in that a transmission electron microscope is combined with an atomic force microscope, positioned within said transmission electron microscope. This device enables atomic force microscopy (AFM) measurements to be made in a TEM environment, thereby enabling simultaneous TEM and AFM measurements, for investigating the relationship between the interaction force between and the geometry of interacting particles.

Preferably, said device comprises a sample holder for placing a sample thereon, a cantilever positioned close to the sample, said cantilever being manufactured from a resilient material and constituting a part of said atomic force microscopy device. Further, said atomic force microscope comprises a probe, being placed on the cantilever, said probe having the shape of a tip, and suitably, said cantilever and said probe are integrated with each other. In this way said tip and sample may be so arranged that an interaction between them is possible.

Further, said device suitably comprises a cantilever deflection measurement device, in order to get a measure on the force interaction between the probe/tip and the sample. In accordance with a preferred embodiment, said cantilever deflection measurement device comprises a radiation source, for irradiating an reflection surface on said cantilever, whereupon said radiation may be detected by a detection means in order to determine an amount of deflection of said cantilever. This is a simple construction for determining the deflection, where the radiation source as well as the detector may be adapted for the mode of operation at issue. According to a further embodiment of the invention, said cantilever deflection measurement device comprises a measurement device mounted on said cantilever for detecting a physical property, that is changeable due to strain. This provides for a very compact construction, since these kinds of measurement device may be made very small and does not require a separate space consuming components, such as the above-mentioned detector. Said measurement device may for example comprise a piezoelectric strain gauge or a magnetoelastic sensor.

Further, said sample holder is moveable, in order to admit an easy movement of the sample in relation to said AFM tip. In this way the sample may easily be moved in order to investigate different areas of the sample surface. Preferably, said sample holder comprises a piezoelectric element in order to provide said moveability. This is a well-tested and stable device for micropositioning of the sample. Suitably, said piezoelectric sample holder is an inertial type slider. A device of this kind is described in for example K. Svensson, F. Althoff, and H. Olin, "A compact inertial slider STM", Meas. Sci. Techn., 8, 1360–1362 (1997), and enables simple and precise micropositioning of the sample.

Finally, the above mentioned issue is resolved in accordance with the invention by a device for insertion in a transmission electron microscope, characterised in that said device comprises an atomic force microscopy device. This enables a user of a transmission electron microscope to supplement the microscope with an AFM insert for extended usability.

BRIEF DESCRIPTION OF THE DRAWINGS

The invention will now be described in closer detail, with reference to the accompanying drawings, in which:

FIG. 3a-f shows a schematic example of a measurement done with a compound microscope in accordance with the invention.

FIG. 4a-f shows a TEM visualisation of measurement done with a compound microscope in accordance with the invention.

FIG. 5 shows graph over a measured force interaction between a sample and AFM tip, for the experiment visualised in FIG. 4a-f.

DETAILED DESCRIPTION OF PREFERRED EMBODIMENTS OF THE INVENTION

Figure 1:
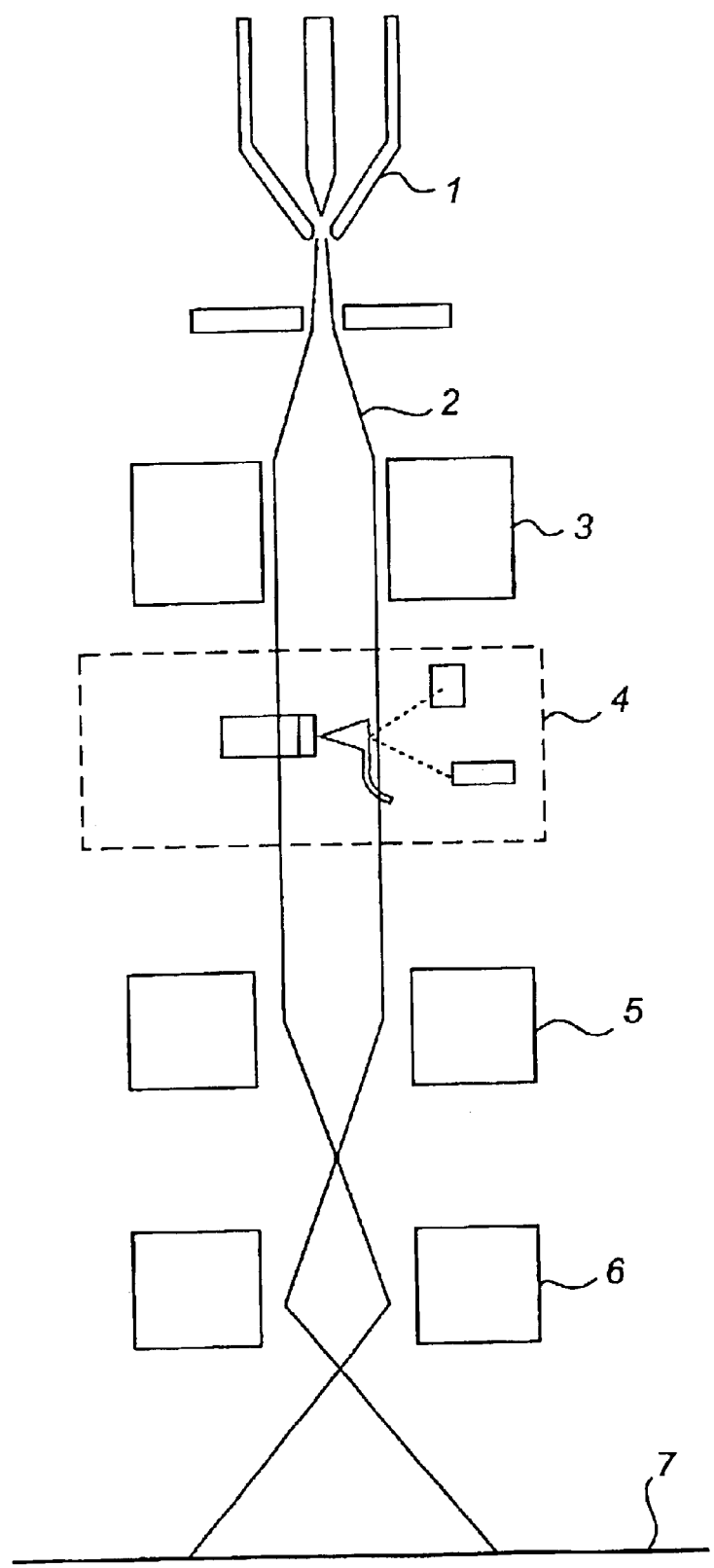
FIG. 1 is a schematic drawing of a transmission electron microscope, in which an atomic force microscope is incorporated.

The combined TEM and AFM microscope comprise a standard transmission electron microscope, such as a Philips® CM200 Super Twin FEG microscope. The configuration of such a standard transmission electron microscope is shown in FIG. 1. The microscope shown in FIG. 1 essentially comprises an electron gun 1, able to produce an electron beam 2. The electron beam passes trough various component such as a condensing lens 3, an object 4, an objective lens 5, a projective lens 6 and is ultimately projected on a screen 7. The function of this microscope is well known, and will not be closer described herein. In the object position, an AFM insert is positioned, see FIG. 1. The AFM insert comprises a sample holder 10, holding a sample 11 having a material surface in a position where it is subjected to said electron beam 2. Said sample holder 10 also constitutes a micropositioning device for said sample and comprises for this purpose a tube of piezoelectric material for fine adjustments of position of the sample, and may also comprise a motor for coarse adjustments of the position in the z-direction (not shown). Said sample 11 is fastened in one end of said tube.

Figure 2:
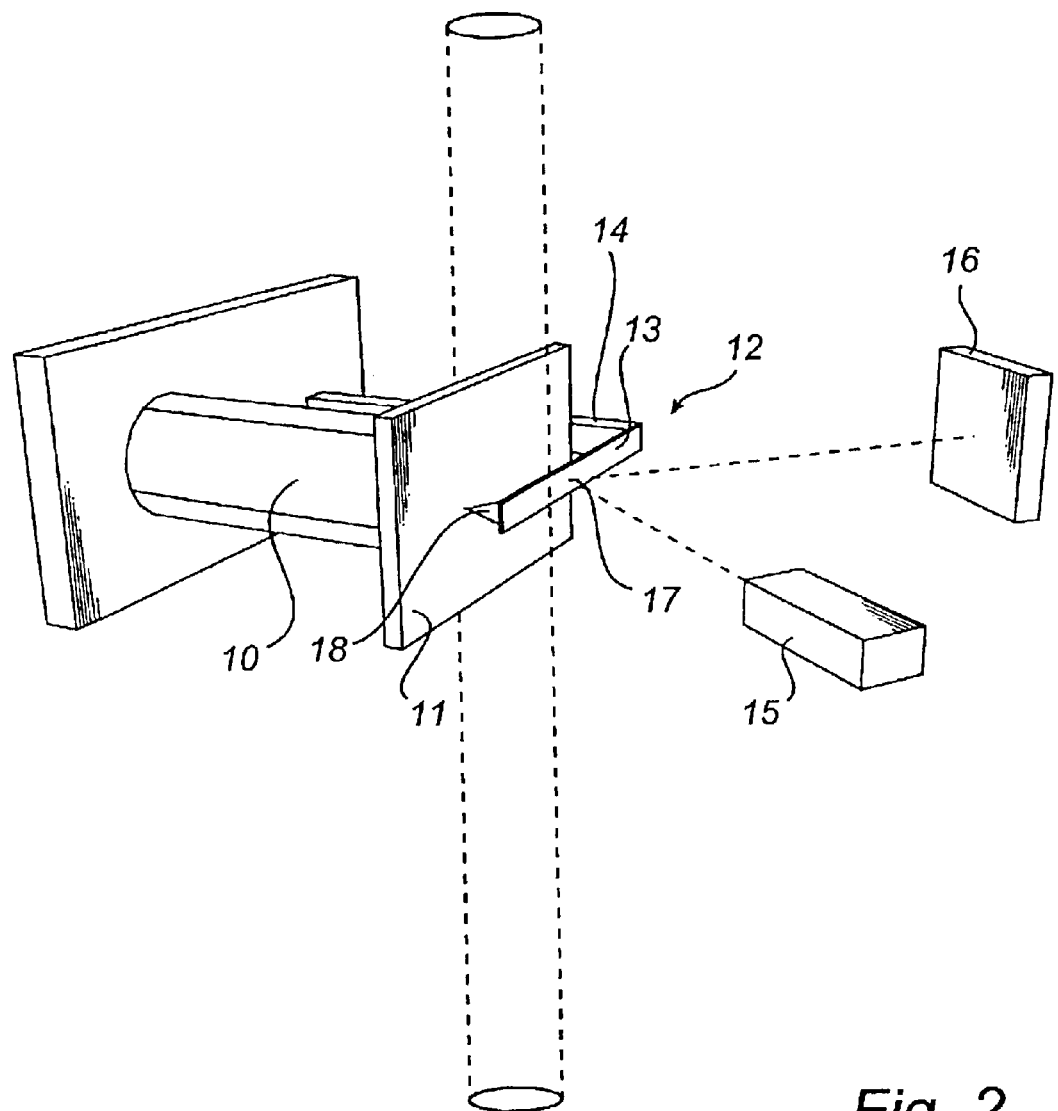
FIG. 2 shows a close-up of an AFM insert for a TEM in accordance with one embodiment of the invention.

Further, said AFM insert comprises a sharp tip or probe 18, mounted on a cantilever 13 of a resilient material. In the embodiment shown in FIG. 2, the cantilever is mounted on a fixed rod 14, but it may also be mounted on a second micropositioning device (not shown), for enabling an adjustment of the AFM tip position. Together, the tip 18 and the cantilever 13 constitute the AFM device 12, and here the tip 18 and cantilever 13 are integrally formed. The AFM tip 18 is positioned so as to be directed towards said sample, as best seen in FIG. 2.

Moreover, means for detecting the cantilever deflection and/or orientation are arranged adjacent to said samples. Said means may for example comprise a laser source 15, producing a laser beam being transmitted to and reflected against a reflection area 17 of said cantilever 13, whereupon the reflected laser beam is detected with a position-sensitive detector 16, such as a bi-cell (or multi-cell) detector on per se known manner, as shown in FIG. 2. The deflection may also be measured by mounting a strain gauge or the like on said cantilever, or by including scanning tunnel microscope or measuring the deflection by means of interferometry (not shown). Further, it is possible to allow an electron beam to be reflected towards the cantilever, whereby the reflection position may be measured by means of a detector, such as a multi-cell detector. Other deflection measurement devices are possible.

The principal operation of the atomic force microscope will now be briefly described. First, the AFM insert is placed in the object position of the TEM, as shown in FIG. 1. It is also possible to have a fixed AFM unit within a TEM. When in the right position the electron beam path of the TEM shall at least cover the area of said tip 18 and a surface area of the sample 11, as shown in FIG. 2. When making a force interaction measurement and visualisation, an electron beam is transmitted through the electron microscopy system, thereby passing through the object position, which results in an imaging of the tip and sample area on said screen 7. As seen in FIG. 2, the imaging in this case will be the AFM insert as seen from the side. Simultaneously, the AFM insert measures the force interaction between the sample 11 and the tip 18 by means of measuring the current deflection of said cantilever 13. The force interaction may be changed by moving the sample and tip in relation to each other by means of said micropositioning device for the sample holder and/or the cantilever. One example of a movement sequence is shown in FIG. 3, as well as a schematic/theoretical graph over the force interaction in this sequence.

With this set-up the contact between the AFM cantilever tip and the sample may be imaged, and simultaneously the force interaction between the sample the tip may be measured. Furthermore, deformation (elastic or plastic) may be studied and followed by TEM imaging.

The method and device in accordance with the invention is equally applicable for different modes of AFM operation, such as contact mode, non-contact mode and intermittent mode.

One experiment with a method and device in accordance with a preferred embodiment of the invention will hereinafter be described with reference to FIGS. 3-5.

The TEM-AFM basically comprises a modified TEM microscope with an AFM insert, with a piezo tube (25 mm long and 3 mm diameter), which is used for fine motion and a motor for coarse z-motion. The TEM-AFM was inserted into a field emission gun TEM (Philips CM200 Super TWIN FEG microscope). The sample and the tip/probe are electrochemically etched gold tips, made from a 0.25 mm diameter wire (99,99% Au).

The AFM tip is a standard silicone nitride tip with a force constant of 0.37 N/m. The AFM tip is coated first with 5 nm of Cr adhesive layer and then by 16 nm of Au. Inside the TEM, the sample is prepared locally by pressing the tip hard into the sample, breaking a contamination layer. The tip-sample force interactions were measured by direct imaging of the motion of the AFM tip (see FIGS. 3 and 4a-e).

Resistance measurements were performed at a bias voltage of 10 mV. The signal was monitored on a digital oscilloscope simultaneously with video TEM images.

FIGS. 4a-e shows a sequence of TEM images where the sample is moved towards and from the AFM tip. The corresponding force-distance curve is found in FIG. 5. First the sample is moved towards the AFM tip. At the moment when the gradient of the attractive tip-sample force exceeded the spring constant of the cantilever, the sudden jump-to -contact occurred at about 1.4 nN. The sample was pressed further in 5 nm and then retracted. A neck was formed between the sample and tip during retraction (FIG. 4f). After the retraction of about 20 nm, which corresponded to an attractive force of 8.7 nN, the jump-off-contact occurred. The area of the neck just before this moment was about 0.6 nm². This gives an adhesion force of about 1 nm per atom, which is consistent with the gold nano-wire force experiments by Rubio, Agraït and Viera (Phys. Rev. Letter 76 (1996) 2302), as well as by theoretical calculations.

The above-described preferred embodiment is only given in exemplifying purpose, and shall not be regarded as limiting the scope of this invention. It shall be realised that several modifications of the above-described embodiment are possible within the scope of the invention as defined in the appended claims. As an example, the shape and material of the sample and tip may be varied, as well as the micropositioning devices used for micropositioning of said sample and/or cantilever. For example micro-motors or various designs of inertial sliders may be used.

What is claimed is:

1. Method for increasing the measurement information available from a standard transmission electron microscope, said information relating to a measurement sample, comprising:

including, in said standard transmission electron microscope, an atomic force microscopy device, visualising a sample and a probe, being a part of said atomic force microscopy device, using the standard transmission electron microscope, and simultaneously investigating a force interaction between said sample and said probe using the atomic force microscopy device being arranged within said standard transmission electron microscope.

2. Method as claimed in claim 1, wherein investigating the force interaction includes:

measuring the deflection of a cantilever on which said probe is fastened, said cantilever and probe being parts of said atomic force microscopy device.

3. Method for increasing the measurement information available from a transmission electron microscope, said information relating to a measurement sample, comprising:

including, in said transmission electron microscope, an atomic force microscopy device, visualising a sample and a probe, being a part of said atomic force microscopy device, using the transmission electron microscope, and simultaneously investigating a force interaction between said sample and said probe using the atomic force microscopy device being arranged within said transmission electron microscope, measuring the deflection of a cantilever on which said probe is fastened, said cantilever and probe being parts of said atomic force microscopy drive, and measuring the deflection by using an electron beam from said transmission electron microscope.

4. Method as claimed in claim 2, wherein measuring the deflection of the cantilever includes:

measuring the deflection by using a measurement device mounted on said cantilever for detecting a physical property, that is changeable due to strain.

5. Method as claimed in claim 2, wherein measuring the deflection of the cantilever includes:

measuring the deflection by using a measurement device comprising a radiation source, for irradiating an reflection surface on said cantilever, whereupon said radiation may be detected by a detection means in order to determine an amount of deflection of said cantilever.

6. Transmission electron microscopy device, comprising: an atomic force microscopy device being positioned within a standard transmission electron microscope, said transmission electron microscopy device further including a sample holder for placing a sample thereon, a cantilever and a probe, being placed on the cantilever, forming part of said atomic force microscopy device and being positioned close to the sample, and a cantilever deflection measurement device, wherein the atomic force microscopy device and the standard transmission electron microscope are arranged to be simultaneously used.

7. Transmission electron microscopy device in accordance with claim 6, wherein said cantilever is manufactured from a resilient material.

8. Transmission electron microscopy device in accordance with claim 6, wherein said probe has the shape of a tip.

9. Transmission electron microscopy device in accordance with claim 6, wherein said cantilever and said probe are integrated with each other.

10. Transmission electron microscopy device in accordance with claim 6, wherein said cantilever deflection measurement device includes a radiation source, for irradiating an reflection surface on said cantilever, whereupon the radiation may be detected by a detection means m order to determine an amount of deflection of said cantilever.

11. Transmission electron microscopy device in accordance with claim 6, wherein said cantilever deflection measurement device includes a measurement device mounted on said cantilever for detecting a physical property, that is changeable due to strain.

12. Transmission electron microscopy device in accordance with claim 6, wherein said sample holder is moveable, in order to admit an easy movement of the sample in relation to said AFM tip.

13. Transmission electron microscopy device in accordance with claim 6, wherein said sample holder includes a piezoelectric element in order to provide said moveability.

14. Transmission electron microscopy device in accordance with claim 13, wherein said piezoelectric sample holder is an inertial type slider.

15. Device for insertion in a standard transmission electron microscope, wherein said device comprises an atomic force microscopy device, as described in claim 6.

* * * * *